US006584334B2

(12) United States Patent
Pereira et al.

(10) Patent No.: US 6,584,334 B2
(45) Date of Patent: Jun. 24, 2003

(54) PROCESS FOR HEAT TREATING SUPERCONDUCTOR WIRE

(75) Inventors: John B. Pereira, Cumberland, RI (US); Steven Hughson, Boylston, MA (US); Elliott Thompson, Coventry, RI (US)

(73) Assignee: American Superconductor Corp., Westborough, MA (US)

( * ) Notice: Subject to any disclaimer, the term of this patent is extended or adjusted under 35 U.S.C. 154(b) by 0 days.

(21) Appl. No.: 10/152,336

(22) Filed: May 21, 2002

(65) Prior Publication Data

US 2002/0183208 A1 Dec. 5, 2002

Related U.S. Application Data

(63) Continuation of application No. 09/309,220, filed on May 10, 1999, now Pat. No. 6,400,970, which is a continuation of application No. 08/235,560, filed on Apr. 29, 1994, now Pat. No. 5,952,270.

(51) Int. Cl.[7] .......................... H01B 12/00; H01L 39/12
(52) U.S. Cl. ..................... 505/230; 505/238; 174/125.1
(58) Field of Search ........................ 174/125.1; 505/230, 505/236, 237, 238

(56) References Cited

U.S. PATENT DOCUMENTS

| 3,807,041 A | 4/1974 | McDougall ................... 29/599 |
| 4,407,062 A | 10/1983 | Sutcliffe et al. ............... 427/62 |
| 4,954,479 A | 9/1990 | Dubots et al. .................. 505/1 |
| 4,965,249 A | 10/1990 | DeWith et al. ................. 505/1 |
| 4,966,886 A | 10/1990 | Hoshiko ....................... 29/599 |
| 5,063,200 A | 11/1991 | Okada et al. ................... 505/1 |
| 5,086,037 A | 2/1992 | Hitotsuyangi et al. ......... 505/1 |
| 5,102,483 A | 4/1992 | Sawada et al. ............... 156/89 |
| 5,140,006 A | * 8/1992 | Woolf ............................ 505/1 |
| 5,252,547 A | 10/1993 | Itozaki et al. .................. 505/1 |
| 5,318,943 A | 6/1994 | Iversen et al. ................ 29/599 |
| 5,531,015 A | 7/1996 | Manleif et al. ............... 29/599 |
| 5,660,541 A | * 8/1997 | Woolf et al. ..................... 432/8 |
| 5,974,336 A | 10/1999 | Yamada et al. ............. 505/230 |
| 6,365,554 B1 | * 4/2002 | Thompson et al. ......... 505/434 |
| 6,387,852 B1 | * 5/2002 | Celik et al. .................. 505/434 |

FOREIGN PATENT DOCUMENTS

| GB | 3611 | of 1900 |
| JP | 404138629 | * 5/1992 |
| JP | 5211013 | 8/1993 |

OTHER PUBLICATIONS

ZYP Coatings YttriumOxide "YMC", Characteristics Data Sheet No Date/Pub. Info.

"Critical Issues in the OPIT Processing of High–$J_c$ BSCCO Superconductors", K.H. Sandhage, et al., JOM 43(3), 21–25 (Mar. 1991).

"Low Temperature Preparation of Porous Metal Structure", Schmeckenbecher, IBM Technical Disclosure Bulletin 14(4) (Sep. 1971).

* cited by examiner

Primary Examiner—Mark Kopec
(74) Attorney, Agent, or Firm—Choate, Hall & Stewart

(57) ABSTRACT

An oxide superconductor wire is prepared by preparing a length of precursor wire for processing into an oxide superconductor wire and coating the precursor wire with an isolating layer. The coated wire is wound onto a reel in a spiralling manner, such that each turn of the spiral is in alignment with the preceding turn of the spiral along an axis perpendicular to the axis of winding. The wound precursor wire is then heated to form the oxide superconductor. The removable isolating layer is prepared by coating the wire with a solution including a metal oxide and a porosity-inducing component, and heating the coated wire so as to induce porosity and control grain size of the metal oxide so as to render the coating removable. The coating should function to isolate the overlapping turns of the wound wire from neighboring wires, so that no diffusion bonding or adherence between the turns occurs. The coating should also be readily removable because the coating can interfere with subsequent processing of the oxide superconductor wire.

20 Claims, 4 Drawing Sheets

| FIG. 1A |
|---------|
| FIG. 1B |

PROCESS FOR HEAT TREATING SUPERCONDUCTOR WIRE

This application is a continuation of U.S. Ser. No. 09/309,220, filed May 10, 1999 now U.S. Pat. No. 6,400,970 which is a continuation of U.S. Ser. No. 08/235,560, filed Apr. 29, 1994 now U.S. Pat. No. 5,952,2709 which is incorporated herein by reference.

OBJECT OF THE INVENTION

The invention relates generally to a system and process for manufacturing high transition temperature ($T_c$) oxide superconductor wire. The invention more particularly relates to a system and apparatus for coating, winding and heat treating high $T_c$ oxide superconductor wire.

BACKGROUND OF THE INVENTION

Many applications of the high $T_c$ oxide superconductors requires forming the superconductor into a wire. Current processes include forming a precursor of the oxide superconductor or the oxide superconductor itself into a wire and heat treating the wire to obtain an oxide superconductor wire. Current developments in high $T_c$ oxide superconductor processing have resulted in the manufacture of increasingly longer lengths of oxide superconductor wire with acceptable current carrying capacity. The loading and unloading of oxide superconductor wire is an important step in the processing of the wire, in particular, to move the wire between wire deforming steps, such as pressing and rolling, and oxide superconductor phase-forming steps, such as sintering and annealing. The prior art wire deforming step is typically carried out by feeding the wire from a conventional spool through the deforming step and taking up the deformed wire onto a second conventional spool. Long lengths of wire can be efficiently wound onto the spool. However, the conventional spool is not readily adaptable for use in furnaces and results in inefficient use of furnace space. Further, the wire tends to sag and become distorted (wavy) because of the coiled form of the wire on the spool. Lastly, the multiple overlapping windings on the spool do not permit efficient oxidation and phase transformation of the oxide superconductor.

A further disadvantage to winding the oxide superconductor wire prior to heat treatment is that overlapping contact between portions of the wire results in diffusion bonding of the wire to itself and the mandrel, thereby degrading superconducting properties and preventing the unspooling of the heat treated wire. Silver is commonly used as a protective cladding for the oxide superconductor, in particular because the cladding itself is electrically conductive and does not prevent oxygen diffusion to the oxide superconductor. However, even the silver cladding will diffusion bond to other portions of the silver-cladded wire which are in contact during heat treatment.

U.S. Pat. No. 5,140,006 discloses a method and apparatus for coating a silver-cladded oxide superconductor wire with a diffusion-inhibiting material and taking up the coated wire onto a spool. Rare earth oxides are specifically disclosed as a desirable diffusion inhibiting material and no disclosure of the desirability of removing the material after treatment is disclosed.

It is the object of the present invention to efficiently process high-$T_c$ superconducting oxide wire by increasing the simplicity and efficiency of the method used to load and unload wire during processing, by reducing adhesion of the wire to itself and by maximizing the use of furnace space during heat treatment.

SUMMARY OF THE INVENTION

In one aspect of the invention, an oxide superconducting wire is prepared by providing an oxide superconductor wire and applying an isolating layer to an external surface of the wire. The isolating layer includes an isolating material and a porosity-inducing component. The coated wire is heated so as to induce porosity into the isolating layer, thereby obtaining a removable porous isolating layer. The coated oxide superconductor wire is then further processed, as required.

In another aspect of the invention, an oxide superconducting wire is prepared by providing an oxide superconductor wire and applying an isolating layer to an external surface of the wire. The isolating layer includes an isolating material and a porosity-inducing component. The coated wire is wound onto a reel in a spiralling manner, such that each turn of the spiral is in alignment with the preceding turn of the spiral along an axis perpendicular to the axis of winding. The coated oxide superconductor wire is then further processed, as required.

By "oxide superconducting wire", as that term is used herein, it is meant a wire at all stages of manufacture, but which can ultimately be processed into a superconductor wire. Therefore, precursor wires, which are converted into an oxide superconductor wire is deemed a superconductor wire for the purposes of the invention. Likewise, a wire which is only partially converted into the oxide superconductor, or which contains the oxide superconductor but requires further processing to optimize the electrical properties are likewise deemed an oxide superconductor wire for the purposes of the invention.

By "in alignment" as that term is used herein, it is meant that each turn of the spiral is in alignment with and substantially completely overlapping with the previous turn of the spiral, such that the wound wire takes on a substantially two-dimensional appearance. The wound wire is similar in appearance to a wound cassette reel of audio tape.

By "porosity-inducing component" as that term is used herein, it is meant a primarily carbon-containing material which is capable of combustion or thermal decomposition with very little or no residues. The space formerly occupied by the component, after such decomposition, provides the requisite porosity.

The oxide superconducting wire prepared by the present invention possesses superior isolation of successive wire layers and the spool and is capable of easy removal of the layer for further wire processing.

BRIEF DESCRIPTION OF THE DRAWING

The novel features of the invention both as to its structure and operation is best understood from the accompanying drawings, taken in conjunction with the accompanying description, in which similar reference character refer to similar parts, and in which.

DETAILED DESCRIPTION OF THE INVENTION

Figure 1A:
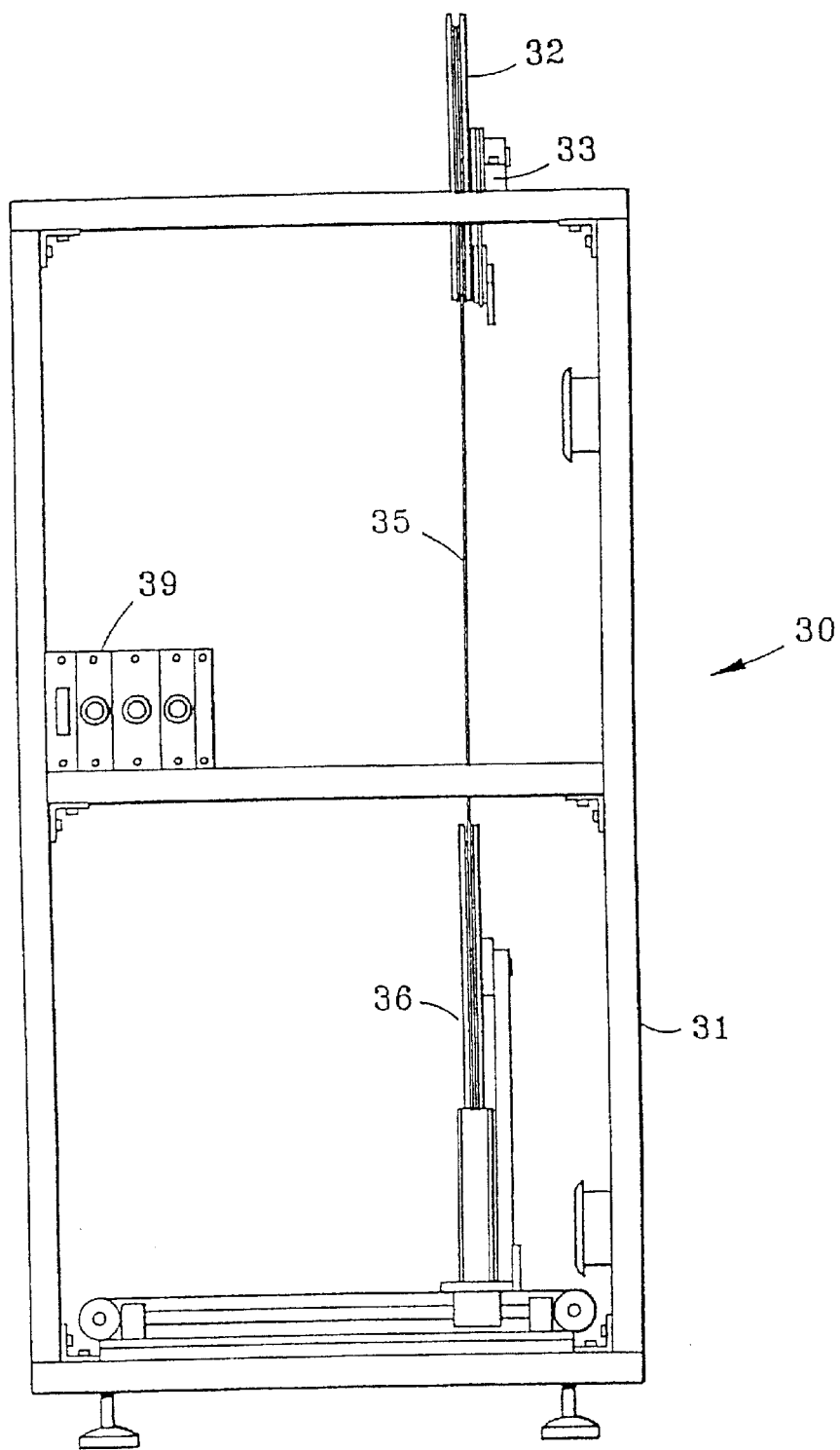
FIG. 1 is (a) a front view and (b) a side view of an apparatus used in coating and winding the precursor wire according to the invention.

The applicants have discovered that coating a superconductor wire with the isolating layer of the present invention results in superior isolation of successive wire layers and in easy removal of the layer for further wire processing. The ease of coating, superiority of its isolating properties and ease of removal provides several processing advantages. Further, the applicants have discovered that the oxide superconductor wire, when wound onto a reel-like support according to the method of the invention, can be processed more efficiently in a furnace environment, without detrimental affect to processing conditions or final superconducting properties. The present invention permits an oxide superconductor wire to be rapidly and efficiently loaded and unloaded onto a cassette reel for furnace processing during oxide superconductor phase-forming steps. The wire then may be transferred to conventional spools for wire-forming steps, if desired. In addition, cassette reels are easily interfaceable with other processing equipment, in particular automated processing equipment, which improves the efficiency of the manufacturing process, if desired.

The applicants have found that use of a porous isolating layer effectively prevents bonding of the wire turns to each other, while being capable of easy removal. The porosity of the layer increases the ease with which the coating can be removed for the wire by reducing surface area contact with the wire and increasing coating brittleness. The isolating material may be any material which prevents sticking of overlapping layers of superconductor wire and which does not poison the superconducting wire and degrade superconducting properties.

A variety of refractory metal oxides may be used in the practice of the invention. The applicants have found oxides of aluminum, calcium, tantalum, magnesium, zirconium and tungsten to be particularly effective. Selection of a particular refractory metal oxide is based on the ease of its removal and effectiveness in isolation of the wire turns. Magnesium oxide (MgO) is a particularly preferred metal oxide. It is preferred to use refractory metal oxides having a relatively large particle size and, in particular, a particle size in the range of 1 to 50 microns. Refractory metal oxide particles of small grain size promote adherence to the wire and make it difficult to remove. The adherence is of a mechanical, rather than a chemical, nature.

The porosity of the layer improves the ease of its removal subsequent to the heat treatment. The ability to remove the isolating layer after heat treatment is important because the layer may impede further processing of the wire. For example, where the isolating layer is not of a uniform thickness, rolling operations result in uneven stress being applied along the wire length and/or width. Porosity may be obtained by including a porosity-inducing component in the isolating layer which is capable of thermal decomposition or combustion with little or no residue. In the subsequent heat treatment, the porosity-inducing component decomposes or combusts, leaving voids in the isolating layer and thereby introducing porosity into the layer. Suitable porosity-inducing components, include but are in no way limited to, cellulose, wood fiber, saw dust, graphite, paraffin, polypropylene and polyethylene.

The isolating layer, including an isolating material and a porosity-inducing component, may be applied using an inert solvent as the carrier liquid. By inert solvent, it is meant herein that the isolating material and the porosity-inducing component are stable in the solvent with no adverse reactions between the solvent and the added materials. It is further required that the porosity-inducing material be insoluble in the carrier liquid, since a soluble material does not occupy a significant volume in the resulting layer.

The isolating material and the porosity-inducing component are added to an inert solvent. The resultant mixture can be a solution (of the isolating material only), dispersion, slurry or a suspension; however, due to the low solubility of the isolating material and the porosity-inducing component, the mixture is most typically a suspension or slurry. The solvent is preferably volatile; so that evaporation of the solvent and subsequent adherence of the layer to the wire occurs rapidly. The solvent is preferably a low molecular weight liquid, such as ethanol, acetone, hexane or water.

The weight percent of added solids (isolating material+ porosity-inducing component) in the mixture may be in the range of 5 to 25 wt %. An exemplary mixture is prepared by adding approximately 100 g powder into 1 liter of ethanol (approx. 10 wt %). The solids range from 5 wt % to 99 wt % isolating material, the balance porosity-inducing component. The greater the level of isolating material in the solids, the more effective the anti-bonding effect of the layer; however, this improvement is obtained at the cost of the removability of the layer. A preferred process uses 50 g MgO, 50 g cellulose in 1 liter of ethanol; however, ratios of 10% MgO/90% cellulose have been successfully used to provide a highly releasable layer.

It may be desirable to vary the relative proportions of the isolating material and porosity-inducing component in the isolating layer during processing of the oxide superconductor wire, where the layer is repeatedly applied and removed. For example, in early processing steps, where greater problems with sticking of the wire turns is observed, it is desirable to apply an isolating layer of higher isolating material content, i.e., greater than 50% MgO. In later processing steps, where bonding of the wire turns is less marked, it is desirable to apply an isolating layer with higher levels of porosity-inducing component to facilitate easy removal of the layer. The appearance of the wire is also greatly improved.

The mixture may be applied to the wire in any conventional manner, including but not limited to, spray coating and dip coating and the like. Spray coating includes generating droplets of the carrier liquid containing the isolating material and porosity-inducing component therein and impinging the droplets on the surface. Dip coating includes passing the wire through a bath which contains a mixture of the isolating material and porosity-inducing component therein. In other embodiments of the invention, the isolating material and the porosity-inducing component may be introduced in two separate application steps (i.e., spray coating of first one, and then the other, component onto the layer). In such instances, the porosity-inducing component should be applied closest to the wire in order to ensure easy release.

The method is described with reference to an apparatus which is suitable for practicing the invention. Coating and loading a wire onto a reel may be accomplished from a second reel, which is useful when the method is to be integrated with automated reel-based technology. As shown in FIGS. 1(a) and (b), an apparatus 30 includes a base 31 which supports a receiving reel 32 using mounting means 33 which is capable of rotation. The receiving reel 32 is driven by a motor 34, which causes the reel to rotate. A wire 35 is first provided on a feeding reel 36 which may be rotatingly mounted on the base 31 by mounting means 37. Upon rotation of the feeding reel 36, wire 35 is unwound. Alignment of the receiving and feeding wheels 32 and 36, respectively, is preset to prevent twisting and distortion of the wire. The wire is loaded onto the receiving reel 32 as a spiral with each turn of the spiral aligned with the previous turn, so that the turns are aligned and substantially completely overlapping along an axis perpendicular to the axis of rotation. A control panel 39 controls the speed of the driving motor 34.

In preferred embodiments, an isolating layer is applied to the wire before it is taken up onto the reel 32. The isolating layer prevents overlapping layers from sticking to each other after heat treatment. To this end, the apparatus 30 includes a receptacle 38 for holding a mixture which comprises an isolating material and a pore-inducing component in an inert solvent. The receptacle 38 may contain a guide pulley (not shown) for directing the wire down into the mixture contained in the receptacle and back out of the receptacle towards the reel 32. The guide pulley additionally serves as a means of stirring the mixture during a coating operation. Some means of agitation is required to maintain dispersion of the suspended insoluble particles. Alternative means of agitation include use of a circulating pump, mechanical stirring or convection means.

In operation, one end of the wire 35 is attached to the receiving reel 32 and the motor 34 is activated. The wire 35 is unwound from feeding reel 36 and drawn around the pulley and into the receptacle 38. The wire contacts the mixture contained in the receptacle, thereby depositing a layer of isolating material on the wire. Before the wire is wound on the reel, the solvent dries to leave an isolating layer on the wire. Drying means (not shown) can be used to increase drying rate, if desired. Drying means include fans or heater or the like suitably between the receptacle 38 and reel 32.

Figure 2:
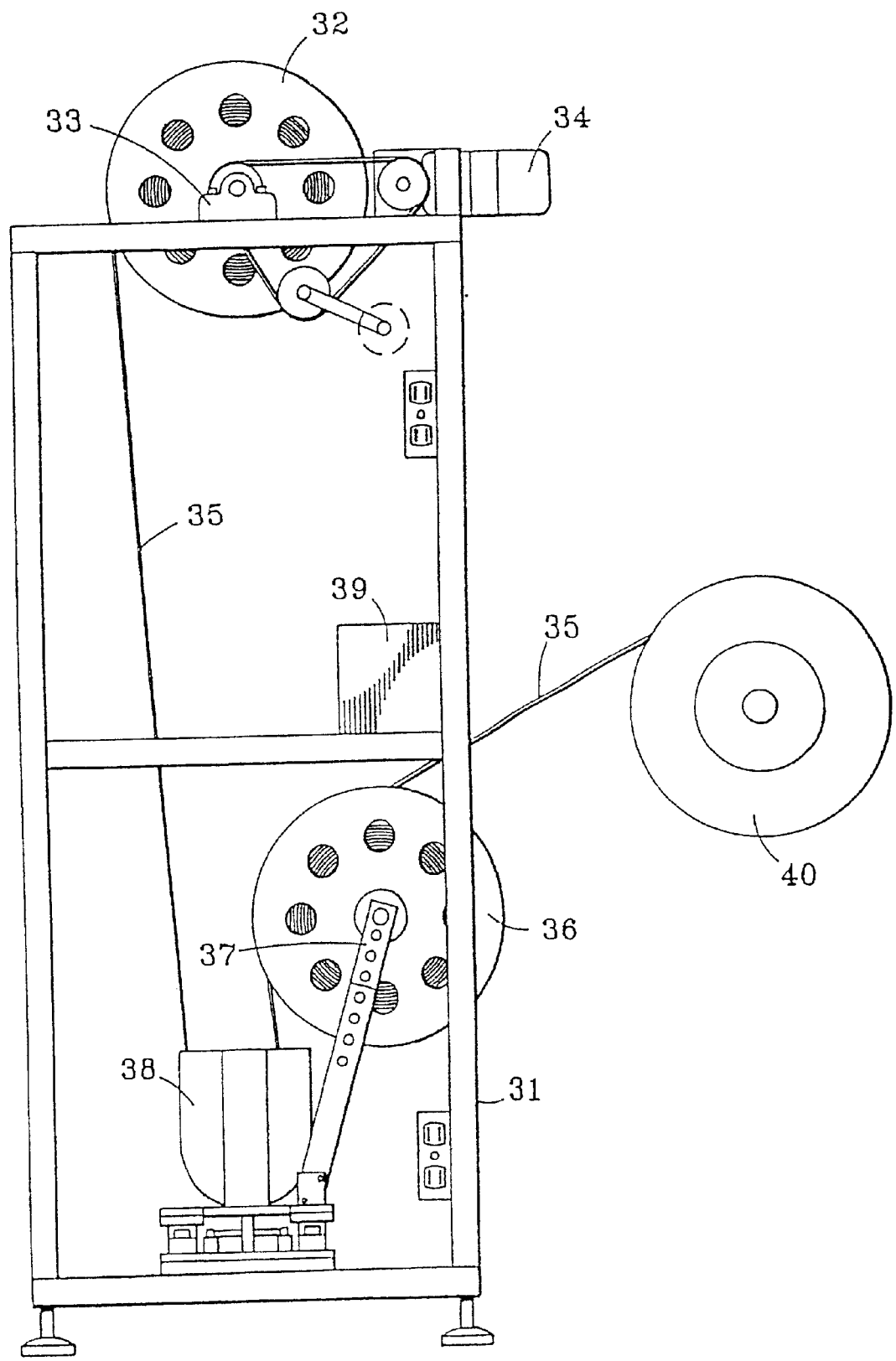
FIG. 2 is a side view of an apparatus used in coating and winding the precursor wire according to the invention.

As described above, coating and loading the wire onto reel 32 may be accomplished from a cassette reel, which is useful when the method is to be integrated with automated processing. Alternatively, coating and loading the wire may be accomplished from spool to reel. To do so, the method and apparatus are modified, as shown in FIG. 2, where like elements are similarly numbered. A spool 40 is positioned adjacent to the feeding reel 36. The wire 35 is fed from the spool 40 and drawn over feeding reel 36. The wire is then processed as described above for a reel to reel transfer. The spool 40 should be positioned a distance from reel 36 so that the wire 35 is not significantly bent or distorted as it is fed out from the spool.

Figure 1B:
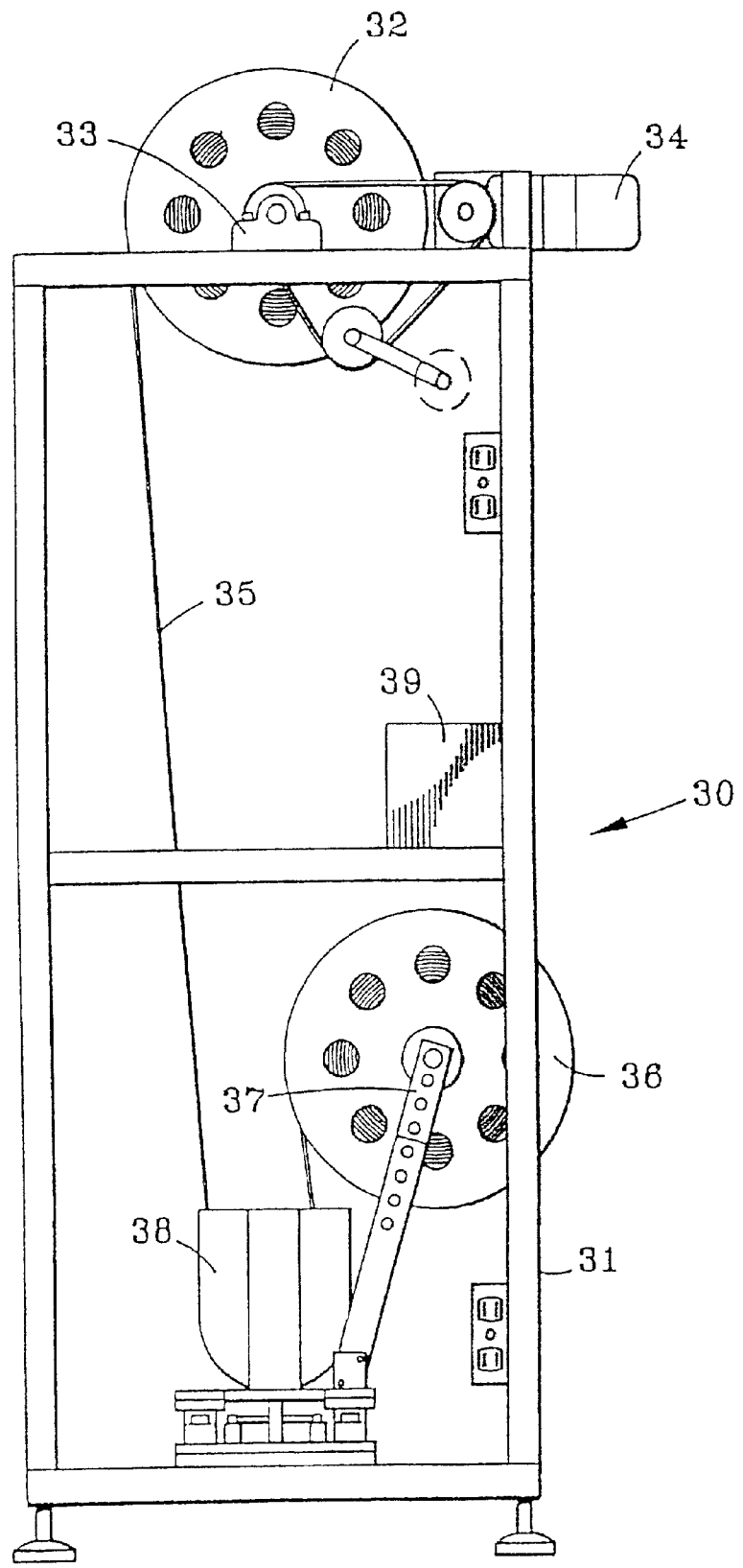

It is also within the scope of the invention to apply the isolating layer by feeding out the oxide superconducting wire from a conventional spool, through a receptacle containing a mixture of the isolating material and porosity-inducing component and onto a second conventional spool. The manner of the process is readily understood with reference to FIGS. 1 and 2, above. Further, when the coating is not removed, it can function as a desirable insulating layer. It is also within the scope of the invention to spray coat the insolating layer onto the wire during the wire loading and unloading process.

It is further contemplated that the wire may take on any geometry, including but not limited to, wires having a circular, avoid, ellipsoidal, rectangular, square and polygonal cross-section. The wire may have a width to thickness ratio in the range of 1 to 1000.

Figure 3A:
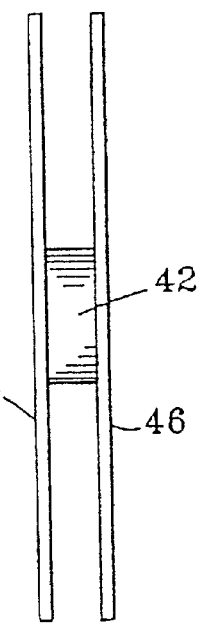
FIG. 3 is (a) an edge on view and (b) a side view of a reel used in winding the wire according to the invention.
Figure 3B:
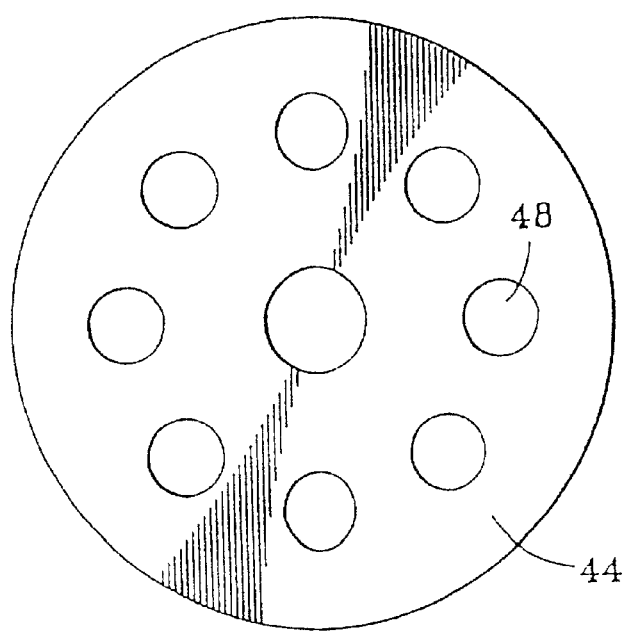

The reel which is used in the above method may be made from a material capable of withstanding high furnace temperatures, such as nickel alloys and stainless steel. With reference to FIG. 3, the reel includes a central mandrel 42 and two opposing end plates 44 and 46, respectively. The mandrel 42 may be of substantially the same width as the wire. The end plates preferably contain apertures 48 to allow the passage of oxygen and/or other processing gases. Alternatively, the reel is made from components capable of assembly and disassembly. In this case, the end plates 44 and 46 are removed from the mandrel 48. The mandrel is a compressible three-piece mandrel which permits it to be removed from the spiral core. The pancake-like wire spiral can be placed on a flat ceramic sheet and heat treated without the reel. It may be preferred to use a retaining ring around the outer circumference of the spiral wire in order to retain its shape during heat treatment. When reel is remove prior to heat treatment, it is not required to be made out of special high temperature materials. The reel can be made of any material without regard to high temperature stability. Aluminum is acceptable.

Subsequent to winding the wire onto the reel, the wire is ready for heat treatment. Such heat treatment includes forming the oxide superconductor phase or optimizing the superconducting properties of the wire. The heat treatment may be carried on the reel, or one or more plates of the reel may be removed prior to heat treatment. During heat treatment, the isolating layer prevents bonding of the neighboring layers. The isolating layer of the invention permits complete overlap of the wire turns without sticking, which is not possible in the prior art.

The isolating layer may be easily removed by passing it under a stream of water, or against an abrasive surface. Ultrasonification will also remove the layer. Other conventional means of removing coatings are within the scope of the present invention.

The method of the present invention can be used to process any oxide superconductor wire. By way of example, and in no way limiting, the oxide superconductor may include rare earth barium cuprates, bismuth strontium calcium cuprates and thallium barium calcium cuprates. The oxide superconductor wires are typically processed with silver or other malleable, inert metal to impart desirable mechanical properties to the wire, which is otherwise too brittle to function as a wire.

The wire used in the invention may be a precursor to an oxide superconductor, such as the metallic alloys disclosed in U.S. Pat. No. 4,826,808 to Yurek et al., herein incorporated by reference, which is then oxidized to form the desired oxide superconductor. Alternatively, the wire may include an oxide superconductor which is subjected to further heat treatment to optimize the formation and properties of the oxide superconductor. The wire preferably contains a malleable, but inert, metal for improved formability and mechanical flexibility. The preferred metal is silver. Oxide superconductor wires suitable for use in the method of the present invention are described in "Critical Issues OPIT Processing of High-$T_c$ BSCCO Superconductors" by Sandhage et al. (JOM43(3), 21–25 (1991)), herein incorporated by reference.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A coated oxide superconducting wire, comprising:
   an oxide superconductor wire, said wire comprising an oxide superconductor or precursor thereto embedded within a matrix of a malleable, inert metal, coated by a removable separating layer.

2. The coated oxide superconducting wire of claim 1, wherein the removable separating layer comprises a metal oxide selected from the group consisting of oxides of aluminum, calcium, tantalum, zirconium and tungsten.

3. The coated oxide superconducting wire of claim 1, wherein the removable separating layer comprises magnesium.

4. The coated oxide superconducting wire of claim 1, wherein the removable separating layer comprises particles having a size in the range of 1 to 50 microns.

5. The coated oxide superconducting wire of claim 1, wherein the coated wire is wound on a reel in a spiraling manner, such that each turn of the spiral is in alignment with the preceding turn of the spiral along an axis perpendicular to the axis of winding.

6. The coated oxide superconducting wire of claim 1, wherein the wire has a cross-sectional shape selected from the group consisting of circular, ovoid, ellipsoidal, rectangular, square, and polygonal.

7. The coated oxide superconducting wire of claim 1, wherein the oxide superconductor comprises a material selected from the group consisting of rare earth barium cuprates, bismuth strontium calcium cuprates, and thallium barium calcium cuprates.

8. The coated oxide superconducting wire of claim 1, wherein the malleable inert metal comprises silver.

9. The coated oxide superconducting wire of claim 1, wherein the removable separating layer is sufficiently impermeable to the malleable inert metal to prevent adjacent portions of the wire from diffusion bonding to one another at elevated temperatures.

10. The coated oxide superconducting wire of claim 1, wherein the removable separating layer can be removed by passing it under a stream of water.

11. A coated oxide superconducting wire, comprising:
an oxide superconductor wire, said wire comprising an oxide superconductor or precursor thereto embedded within a matrix of a malleable, inert metal, coated by a removable separating layer, the separating layer comprising a material selected to prevent the oxide superconductor wire from adhering to itself during heat treatment of the oxide superconductor or precursor.

12. The coated oxide superconducting wire of claim 11, wherein the separating layer comprises a metal oxide selected from the group consisting of oxides of aluminum, calcium, tantalum, zirconium and tungsten.

13. The coated oxide superconducting wire of claim 11, wherein the separating layer comprises particles having a size in the range of 1 to 50 microns.

14. The coated oxide superconducting wire of claim 11, wherein the coated wire is wound on a reel in a spiraling manner, such that each turn of the spiral is in alignment with the preceding turn of the spiral along an axis perpendicular to the axis of winding.

15. The coated oxide superconducting wire of claim 11, wherein the wire has a cross-sectional shape selected from the group consisting of circular, ovoid, ellipsoidal, rectangular, square, and polygonal.

16. The coated oxide superconducting wire of claim 11, wherein the oxide superconductor comprises a material selected from the group consisting of rare earth barium cuprates, bismuth strontium calcium cuprates, and thallium barium calcium cuprates.

17. The coated oxide superconducting wire of claim 11, wherein the malleable inert metal comprises silver.

18. The coated oxide superconducting wire of claim 11, wherein the removable separating layer can be removed by passing it under a stream of water.

19. A coated oxide superconducting wire, comprising: an oxide superconductor wire, said wire comprising an oxide superconductor or precursor thereto embedded within a matrix of a malleable, inert metal, coated by a separating layer comprising magnesium oxide, wherein the separating layer prevents the oxide superconductor wire from adhering to itself during heat treatment of the oxide superconductor or precursor.

20. A coated oxide superconducting wire, comprising:
an oxide superconductor wire, said wire comprising an oxide superconductor or precursor thereto embedded within a matrix of a malleable, inert metal, coated by a separating layer,
wherein the separating layer is characterized in that enough of the separating layer may be taken off the wire that a subsequent rolling operation does not result in uneven stress being applied to the wire due to the presence of the separating layer.

* * * * *